United States Patent [19]
Elliott

[11] 3,938,048
[45] Feb. 10, 1976

[54] FREQUENCY MEASURING APPARATUS

[75] Inventor: Michael F. Elliott, St. Joseph, Mich.

[73] Assignee: Heath Company, Benton Harbor, Mich.

[22] Filed: Oct. 10, 1974

[21] Appl. No.: 513,851

[52] U.S. Cl. ............. 325/455; 324/78 D; 324/79 D
[51] Int. Cl.² .......................................... H04B 1/16
[58] Field of Search.... 324/78 R, 78 D, 79 R, 79 D; 325/398, 455; 331/64

[56] References Cited
UNITED STATES PATENTS

| | | | |
|---|---|---|---|
| 3,701,951 | 10/1972 | Krausser | 324/79 D |
| 3,753,119 | 8/1973 | Close | 325/455 |
| 3,758,853 | 9/1973 | Dionne | 324/78 D |

Primary Examiner—Benedict V. Safourek
Attorney, Agent, or Firm—William R. Sherman; John D. Crane

[57] ABSTRACT

A multiband radio transceiver capable of operating in the CW, USB, and LSB modes is disclosed including a dual conversion receiver having digital apparatus for displaying the carrier frequency of the signal to which the transceiver is tuned. A mixer is included for deriving a premix signal related in frequency to the frequencies of two local oscillator signals. The display apparatus includes a counter for counting the frequency of the premix signal. In order to provide a direct display of the tuned signal carrier frequency, a number which varies according to the intermediate frequency of the signal to which the transceiver is tuned is loaded into the counter prior to occurrence of the counting operation. Apparatus is provided for loading the proper number into the counter in accord with the operating mode of the transceiver.

8 Claims, 3 Drawing Figures

3,938,048

FREQUENCY MEASURING APPARATUS

BACKGROUND OF THE INVENTION

This invention relates generally to frequency measuring apparatus and, in particular, relates to apparatus for indicating the frequency of operation of radio apparatus capable of operation in multiple modes and of radio apparatus using multiple frequency conversion and, in greater particular, relates to apparatus for providing a direct visual indication of the carrier frequency of the signal to which a multiple mode radio apparatus is tuned.

The desirability of apparatus for providing a direct, digital, visual indication of the signal to which a radio receiver is tuned is well known in the art. Such tuning indicators have the capability of being very accurate and dispensing with the calibration, alignment, and stability problems associated with traditional dial plate tuning indicators. An example of the digital tuning indicators provided by the prior art together with a more complete discussion of the advantages of digital tuning indicators may be found in U.S. Pat. No. 3,758,853 to W. R. Dionne, et al., which issued on Sept. 11, 1973. Another digital tuning indicator of the prior art forms the subject matter of U.S. Pat. No. 3,244,983 to R. J. Ertman which issued on Apr. 5, 1966. A radio receiver capable of receiving signals on the broadcast AM and FM frequency bands and including a digital frequency indicating apparatus was manufactured by The Magnavox Company, Fort Wayne, Indiana, under the chassis number R247 and is described in its service manual 1490.

However, the digital tuning indicators of the prior art have had various disadvantages associated therewith. Many of those indicators have been excessively complex in design and construction and have been excessively costly. Many of the digital indicators of the prior art have not been sufficiently accurate to meet present day requirements. Some of the digital tuning indicators of the prior art, such as that mentioned in the above-noted patent to Ertman, have not been capable of use in multi-conversion radio apparatus. Some of the digital tuning indicators of the prior art have not been capable of use in multi-mode radio apparatus wherein the same tuning apparatus is used to tune signals having a plurality of different modes. Some of the digital tuning indicators of the prior art have relied for their operation on the generation of signals at frequencies which degraded the operation of the apparatus. As an example of the last-mentioned disadvantage, it has been found to be particularly disadvantageous in radio receiver digital tuning indicators to make use of a signal at the frequency of the signal being received as such a signal interferes with and degrades reception of the received signal.

SUMMARY OF THE INVENTION

A digital, direct reading tuning indicator for a multi-conversion, multi-mode radio apparatus is provided by this invention which comprises apparatus for forming a signal having a frequency related to the frequencies of the local oscillator signals used in the apparatus, a digital counter for counting the frequency of that signal, and apparatus for altering the count obtained by the digital counter by variable amounts dependent upon the mode of operation of the apparatus.

Accordingly, it is an object of this invention to provide a digital, direct reading tuning indicator for multi-mode and multi-conversion radio apparatus.

It is an object of this invention to provide such a tuning indicator which is capable of high degrees of accuracy.

It is an object of this invention to provide such a tuning indicator which does not undesirably degrade the performance of the remainder of the radio apparatus.

It is an object of this invention to provide such a tuning apparatus which indicates the carrier frequency of the signal to which the radio apparatus is tuned and may simply and conveniently be altered to provide that indication upon changes in the mode of the tuned signal.

It is an object of this invention to provide such a tuning apparatus which indicates the carrier frequency of the signal to which the radio apparatus is tuned and may simply and conveniently be altered to provide that indication upon changes in the mode of operation of the apparatus.

It is an object of this invention to provide such a tuning apparatus which is characterized by simplicity in design, economy of construction, and ease in operation.

Further objects and advantages of this invention will be evident from the following specification and claims and the attached drawing and will be apparent to those skilled in the art.

DESCRIPTION OF THE PREFERRED EMBODIMENTS

Figure 1:
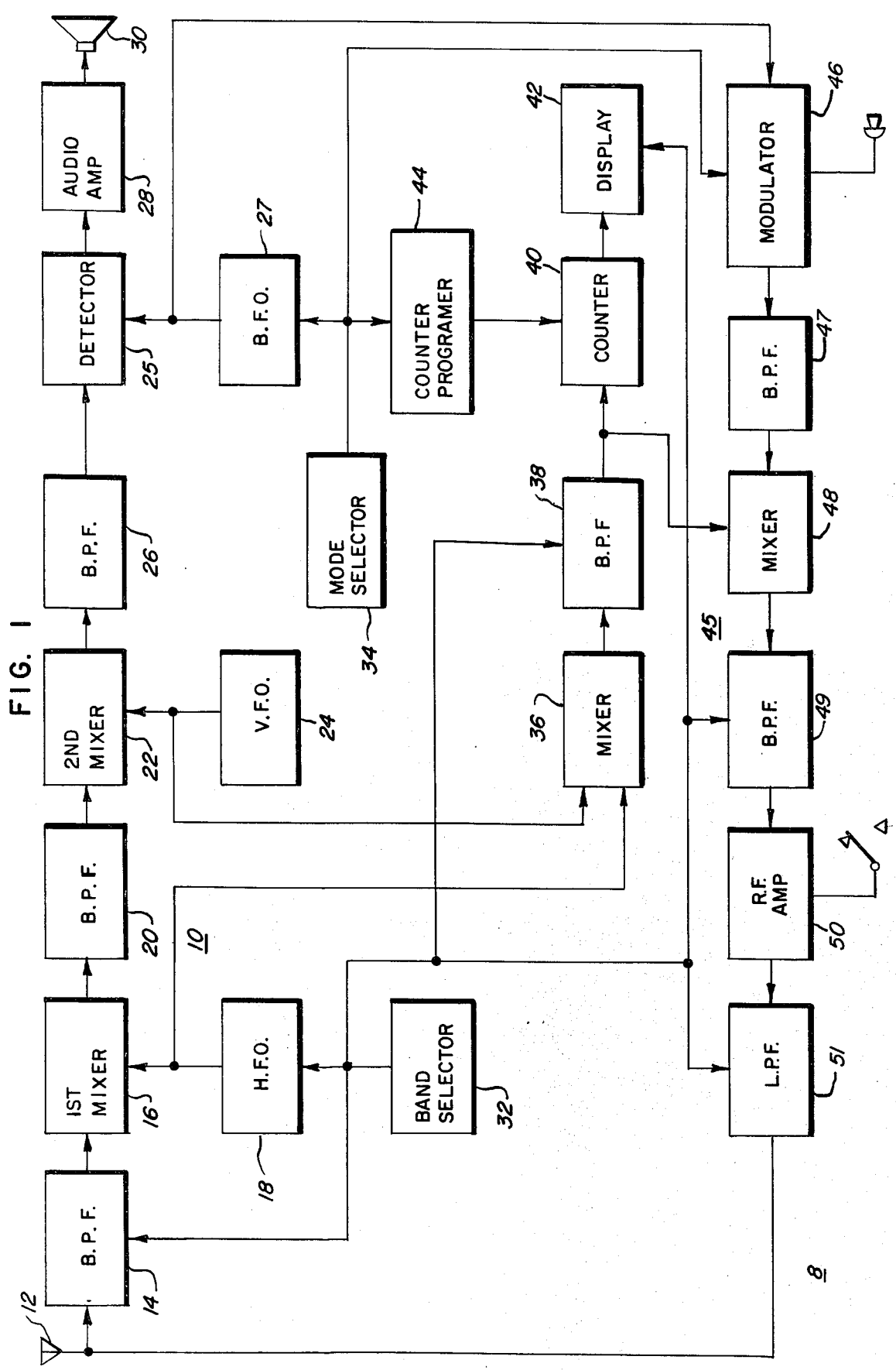
FIG. 1 is a block diagram of a multi-band, multi-conversion, multi-mode radio transceiver incorporating one embodiment of this invention.

The preferred embodiment of this invention will now be described with reference to FIGS. 1–3 of the drawing. It will be apparent to those skilled in the art that this invention is of much broader application than the single embodiment shown in the drawing.

There is disclosed in FIG. 1 in block diagram form a radio transceiver 8 including a double conversion superheterodyne receiver 10 and having a frequency measuring apparatus of the present invention. The transceiver 8 is capable of receiving and transmitting signals in a plurality of different frequency bands and in either the continuous wave (CW), upper sideband (USB), or lower sideband (LSB) modes. The receiver 10 includes an antenna 12 coupled to an input of a bandpass filter 14 which, in turn, has its output coupled to an input of a first mixer 16. The bandpass filter 14 is relatively broadly tuned so that it is effective to pass all signals received within one of the frequency bands of operation of receiver 10. Further, the tuning of that filter may be altered so that its passband corresponds to the different frequency bands of receiver 10. An output of a high frequency oscillator 18 (HFO) is coupled to a second input of first mixer 16. The frequency of operation of HFO 18 may be altered in accord with the frequency band to which the receiver is tuned but is chosen to be above all the frequencies in the corresponding band. The first mixer heterodynes the received RF signals with the output signal of the HFO 18 and produces signals at frequencies equal to the sum and differences of the frequency of the HFO and the frequencies of the RF signals applied thereto by bandpass filter 14. The output of first mixer 16 is applied through a bandpass filter 20 to an input of a second mixer 22. Bandpass filter 20 selects the difference frequency signals present in the output of first mixer 16 and attenuates the sum frequency signals.

The output of a variable frequency oscillator 24 (VFO) is applied to a second input of second mixer 22. The operating frequency of oscillator 24 is below the frequencies of the signals in the output of bandpass filter 20 and is continuously and manually variable over a predetermined frequency range. The second mixer 22 heterodynes the output signals of bandpass filter 20 with the output signal of the VFO 24 and produces signals at frequencies equal to the sum and differences of the frequency of the VFO and the frequencies of the signals at the output of bandpass filter 20. The output of second mixer 22 is applied through a bandpass filter 26 to a detector 25. The bandpass filter 26 selects the difference frequency signals present in the output of second mixer 22 and attentuates the sum frequency signals. The passband of filter 26 is relatively narrow and, in particular, is of a width comparable to the width of the frequency spectrum occupied by a single received RF signal.

A beat frequency oscillator 27 (BFO) having its output coupled to a second input of detector 25 is provided. The frequency of the BFO for USB and LSB signals is the frequency corresponding to the carrier of the received signal and for CW signals is at a frequency slightly offset from the frequency corresponding to the carrier of the received signal. Detector 25 heterodynes the signals applied thereto from bandpass filter 26 and BFO 27 to obtain an audio signal which is amplified by an audio signal amplifier 28 and reproduced by a speaker 30.

Apparatus is also included within transceiver 8 for controlling the band and mode of operation thereof. A band selector apparatus 32 is provided which is operative to simultaneously control the frequency range to which bandpass filter 14 is tuned and the frequency of the HFO 18. A mode selector apparatus 34 is provided which is operative to alter the frequency of operation of BFO 27 in accord with the mode of operation of the transceiver, i.e., in accord with whether it is being used as a transmitter or receiver and whether with USB, LSB, or CW signals.

The components of the apparatus of FIG. 1 as thus far described are well known and need not be further discussed here. The construction of apparatus to perform the required functions will be obvious to those having ordinary skill in the art.

Turning now to the features of this invention, the transceiver 8 additionally includes a mixer 36 having a first input coupled to the output of HFO 18 and a second input coupled to the output of VFO 24. Mixer 36 is operative to produce signals at frequencies equal to the sum and difference of the frequencies of the signals applied to the inputs thereof. The output of mixer 36 is applied through a bandpass filter 38 to a counter 40. The bandpass filter 38 selects the difference frequency signal and attenuates the sum frequency signal and produces at its output a signal hereinafter referred to as the "premix" signal. The center frequency of bandpass filter 38 may be altered in accord with the band to which the receiver 10 is tuned and is coupled to band selector apparatus 32 for this purpose. Counter 40 counts the number of cycles occurring during a fixed period of time in the premix signal. The output of the counter is coupled to a display apparatus 42 which gives a visual indication of the count achieved by counter 40 and, thus, of the carrier frequency of the signal received by the receiver 10. A counter programmer 44 is provided which is coupled to both the mode selector apparatus 34 and counter 40. The counter programmer 44 programs the operation of counter 40 so that display apparatus 42 provides a direct visual reading of the frequency of the signal received by the receiver. The programming is achieved by setting a predetermined number into counter 40 prior to the commencement of the counting period. That preset number is altered in accord with the nature of the tuned signal, i.e., CW, USB, or LSB, and for CW signals, according to whether the transceiver is being used as a transmitter or a receiver. The coupling between the mode selector apparatus 34 and counter programmer 44 effects this alteration. The construction of apparatus to perform the functions of mixer 36 and bandpass filter 38 will also be apparent to those skilled in the art and, accordingly, those circuits will not be further discussed here. The construction and operation of counter 40, display apparatus 42, and counter programmer 44 will be futher discussed in relation to FIG. 2.

Also included within the transceiver 8 of FIG. 1 is apparatus 45 to perform the transmit function. That apparatus includes a modulator 46 having a first input coupled to the output of BFO 27 and a second input coupled to a microphone for receiving audio speech signals. Modulator 46 is also coupled to the mode selector apparatus 34. The modulator 46 is such that when the mode selector apparatus selects either the USB or LSB modes, the modulator produces at an output a double sideband, suppressed carrier signal on the appropriate sideband with the frequency of the suppressed subcarrier being the frequency of the output of BFO 27. When the mode selector apparatus 34 selects the CW mode, modulator 46 produces at its output a signal at the frequency of the output of BFO 27. The output of modulator 46 is applied through a bandpass filter 47 to remove the undesired sideband in the USB or LSB modes. The output of bandpass filter 47 is applied to a first input of a mixer 48 while the output of bandpass filter 38 is coupled to a second input of that mixer. Mixer 48 produces at its output signals at frequencies equal to the sum and difference of the frequencies of the signals applied to the inputs thereof. The output of mixer 48 is applied through a bandpass filter 49 to the input of a radio frequency amplifier 50. The bandpass filter 49 selects the sum frequency signals in the output of mixer 48 and attenuates the difference frequency signals. The center frequency of bandpass filter 49 may be altered in accord with the band to which the receiver 10 is tuned and is coupled to band selector apparatus 32 for this purpose. Radio frequency amplifier 50 amplifies the signal at its input, which amplified signal is applied through a low-pass filter 51 to antenna 12. A key is associated with amplifier 50 for controlling the presence of a signal at the output of amplifier 50 during the transmission of CW signals. Low-pass filter 51 attenuates undesirable high frequency components which may be present in the output of radio frequency amplifier 50. The upper cutoff frequency of low-pass filter 51 may be altered in accord with the band to which the receiver 10 is tuned and is coupled to band selector apparatus 32 for this purpose. It will also be necessary to include within transceiver 8 circuitry for coordinating the operation of the receiver 10 and transmitter 45 portions and so that, in particular, the output of low-pass filter 51 is not applied directly to the input of bandpass filter 14 when radio frequency amplifier 50 is operative. Both the function and construction of such circuitry will be readily apparent to those skilled in the art and need not be further discussed here. Similarly, the construction of apparatus to perform the required function of the other components of the transmitter 45 will be readily apparent to those skilled in the art and need not be further discussed here.

One transceiver 8 of this invention was constructed which was capable of both transmitting and receiving signals on the 80, 40, 20, 15, and 10 meter amateur radio bands and also of receiving signals on the 15.0 to 15.5 MHz band for reception of signals broadcast by WWV, a radio station operated by the U.S. Government and broadcasting standard radio, audio, and time signals. The frequencies of the tuned radio signals and the corresponding frequency of operation of HFO 18 and the passband of bandpass filter 38 are listed as follows:

| Band | Signal Frequencies | HFO 18 Frequency | BPF 38 Passband |
| --- | --- | --- | --- |
| 80 Meters | 3.5–4.0 MHz | 12.395 MHz | 6.895–7.395 MHz |
| 40 Meters | 7.0–7.5 MHz | 15.895 MHz | 10.395–10.895 MHz |
| WWV | 15.0–15.5 MHz | 23.895 MHz | 18.395–18.895 MHz |
| 20 Meters | 14.0–14.5 MHz | 22.895 MHz | 17.395–17.895 MHz |
| 15 Meters | 21.0–21.5 MHz | 29.895 MHz | 24.395–24.895 MHz |
| 10 Meters | 28.0–28.5 MHz | 36.895 MHz | 31.395–31.895 MHz |
| 10 Meters | 28.5–29.0 MHz | 37.395 MHz | 31.895–32.395 MHz |
| 10 Meters | 29.0–29.5 MHz | 37.895 MHz | 32.395–32.895 MHz |
| 10 Meters | 29.5–30.0 MHz | 38.395 MHz | 32.895–33.395 MHz |

In that transceiver, the passband of filter 20 is approximately 8.395–8.895 MHz, the range of operation of VFO 24 is 5.0–5.5 MHz, the center frequency of filters 26 and 47 are 3.395 MHz and their passbands are approximately 2.1 kHz, and the frequency of operation of BFO 27 is 3.3936 MHz for LSB signals, 3.3964 MHz for USB signals, and 3.3964 MHz for CW signals in the receive mode and 3.3957 of CW signals in the transmit mode. As previously mentioned, in order to generate an audio tone for reception of CW signals, the frequency of the BFO must be offset from the CW carrier frequency by about 700 Hz. With this selection of BFO frequencies, the frequency used for USB signals, 3.3964 MHz, may also be used for reception of CW signals at 700 Hz removed therefrom, i.e., signals appearing at 3.3957 MHz in the output of bandpass filter 26. However, BFO 27 operates at the corresponding carrier frequency of 3.3957 MHz during transmission of CW signals so that the output of the transmitter will be at the same frequency as the received signal.

Figure 2:
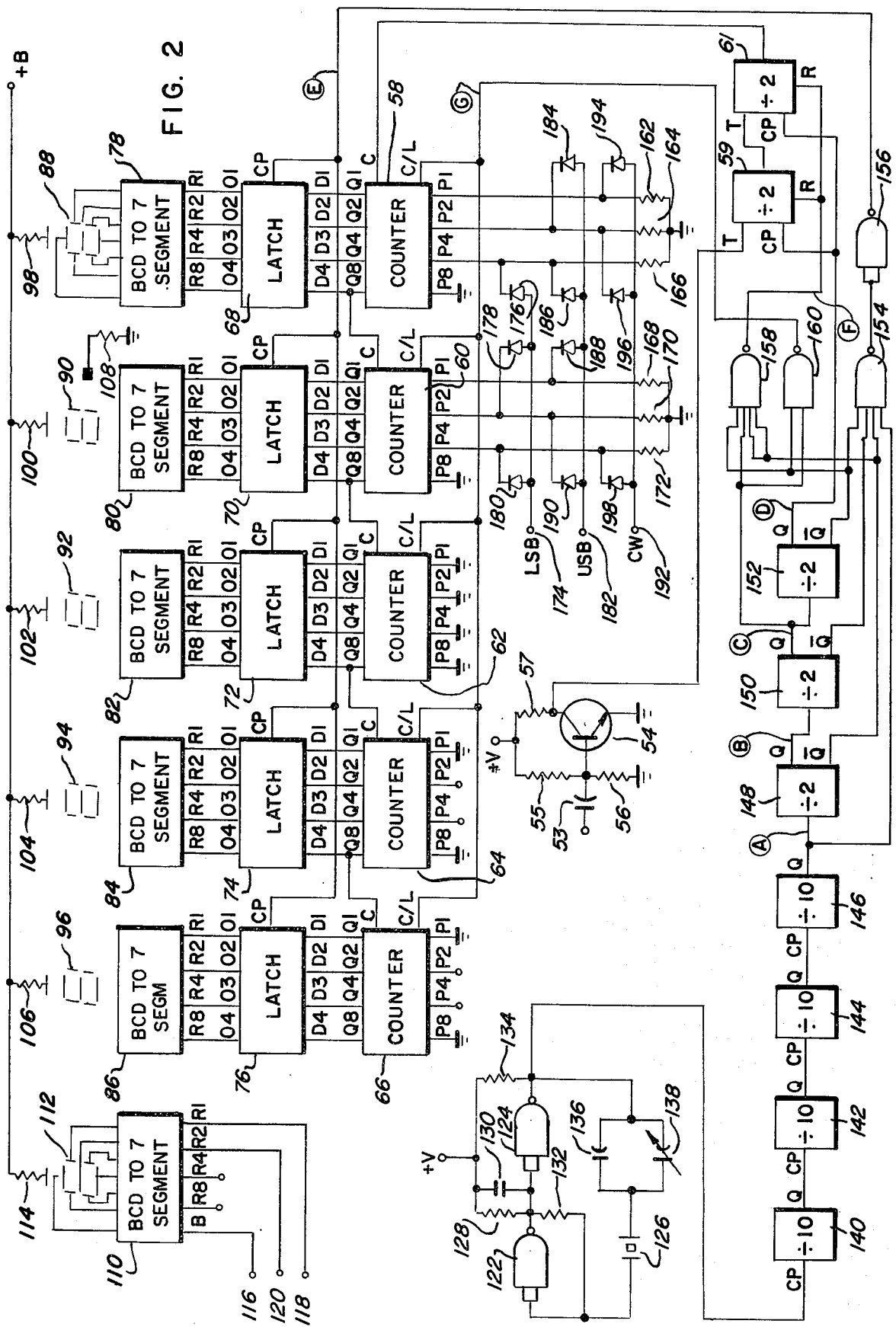
FIG. 2 is a detailed, schematic diagram of a portion of the apparatus of FIG. 1.

Turning now to FIG. 2 of the drawing, there is disclosed therein apparatus for performing the function of counter 40, display 42, and counter programmer 44 of the apparatus of FIG. 1 making use of the frequencies referred to in the immediately preceding paragraph. In the following description of that apparatus a convention will be used wherein a positive voltage represents a logic level 1 signal and a ground level voltage represents a logic level 0 signal. The premix signal from bandpass filter 38 is applied through a capacitor 53 to the base of an NPN transistor 54. That base is coupled to a positive voltage supply V through a resistor 55 and to a circuit ground through a resistor 56. The collector of transistor 54 is coupled to positive voltage supply V through a resistor 57. Transistor 54 and its associated components form an amplifier for the premix signal. The output of that amplifier is taken from the collector of transistor 54 and applied to the toggle input T of a first clocked flip-flop 59. The output of flip-flop 59 is, in turn, applied to the toggle input T of a second clocked flip-flop 61. Flip-flops 59 and 61 are such that their outputs change states in response to the signals at their inputs only when a logic level 1 signal is applied to the clock input thereof. They are also such that they may be reset so their outputs are at logic level 0 when a logic level 0 signal is applied to reset inputs R thereof. Flip-flops 59 and 61 serve to divide the frequency of the premix signal by four and, thus, reduce the frequency response requirements of the following circuit elements.

The output of flip-flop 61 is coupled to the count input C of a first presettable decade counter 58. The counter 58 has four outputs Q1, Q2, Q4, and Q8, having the binary values 1, 2, 4, and 8, respectively, associated therewith and four inputs P1, P2, P4, and P8 also having the binary values 1, 2, 4, and 8, respectively, associated therewith. A count/load input C/L is provided. The counter 58 is such that when the count/load input is at logic level 1, each negative going pulse from logic level 1 to logic level 0 applied to the count input will cause the number represented by the outputs Q1, Q2, Q4, and Q8 to advance by one, until reaching the count of nine when the counter will return to zero, but when the count/load input is at logic level 0, the binary number represented by the inputs P1, P2, P4, and P8 will be set into the counter and appear on the counter outputs. For inputs P1, P2, P4, and P8, an unconnected or isolated input is the equivalent of a logic level 1 signal.

The circuit of FIG. 2 includes four additional decade counters 60, 62, 64, and 66 identical to counter 58. Output Q8 of counter 58 is coupled to the count input of counter 60 and, similarly, the outputs Q8 of counters 60, 62, and 64 are each coupled to the count inputs of counters 62, 64, and 66, respectively. The Q8 output of each counter has a negative going transition from logic level 1 to logic level 0 only when the state of that counter passes from nine to zero so that each counter 60, 62, 64, and 66 advances one count when the preceding counter 58, 60, 62, and 64, respectively, has counted ten pulses. Thus, the decade counters 58, 60, 62, 64, and 66 produce at their outputs in binary coded decimal form a count of the pulses applied to the count input of counter 58.

Five 4-bit latch memories 68, 70, 72, 74, and 76 are provided, each having four inputs D1, D2, D3, and D4 and four corresponding outputs 01, 02, 03, and 04, respectively. Each four-bit latch memory includes a clock input CP and is such that when the clock input is at logic level 1, the signals present at the output are the same as the signals present at the corresponding inputs, but when the clock input is at logic level 0, the signals present at the outputs remain fixed no matter what the state of the signals at the input. Outputs Q1, Q2, Q4, and Q8 of decade counter 58 are coupled to inputs D1, D2, D3, and D4, respectively, of 4-bit latch memory 68 and the outputs of counters 60, 62, 64, and 66 are similarly coupled to the inputs of four-bit latch memories 70, 72, 74, and 76, respectively.

The outputs of the four-bit latch memories are each coupled to corresponding inputs of binary-coded-decimal to seven-segment converters 78, 80, 82, 84, and 86, respectively. Each of the converters has four inputs R1, R2, R4, and R8 having binary values 1, 2, 4, and 8, respectively, associated therewith and 7 outputs A, B, C, D, E, F, and G. The converters are operative to convert the number represented in binary form at their inputs into seven signals operative to drive a seven-segment digit display. Five seven-segment digit displays 88, 90, 92, 94, and 96 are provided each appropriately coupled to a corresponding converter 78, 80, 82, 84, and 86. Only the connections between converter 78 and digit display 88 are shown in FIG. 2 for economy of drawing, but the remaining digit displays are similarly connected to their corresponding converters. Each of the digit displays 88, 90, 92, 94, and 96 includes an anode element coupled through a resistor 98, 100, 102, 104, and 106, respectively, to a source of relatively high positive voltage B. Digit display 90 may also include an element for displaying a decimal point which is coupled to circuit ground through a resistor 108. In the total display provided by digit displays 88, 90, 92, 94, and 96, the digit represented by display 88 is the least significant, that by display 90 the next most significant, and so on with the digit of display 96 being the most significant. Additionally, another binary-coded-decimal to seven-segment converter 110 and another seven-segment digit display 112 identical to the other converters and displays are provided. Converter 110 and display 112 are interconnected just as are converter 78 and display 88. The anode of display 112 is coupled through a resistor 114 to positive voltage supply B. Converter 110 has a blanking input B which, when a logic level 1 signal is applied thereto, insures that no digit is shown on display unit 112 no matter what signals are present at inputs R1, R2, R4, and R8. Inputs B, R1, and R2 are coupled to circuit points 116, 118, and 120, respectively, which, in turn, are coupled to the band selector apparatus 32 for reasons which will subsequently be made apparent.

The apparatus of FIG. 2 also includes timing circuitry for timing the operation of the counters and latch memories. The timing circuitry includes an oscillator operating at 1 MHz. The oscillator is comprised of a first NAND gate 122, a second NAND gate 124, and a 1 MHz crystal 126. The output of gate 122 is coupled through the parallel combination of a resistor 128 and a capacitor 130 to positive voltage supply V, through a resistor 132 to each of the inputs thereof, and to each of the inputs of gate 124. The output of gate 124 is coupled to positive voltage supply V through a resistor 134 and through the parallel combination of a capacitor 136 and a variable capacitor 138 to a first terminal of crystal 126. The second terminal of crystal 126 is coupled to the inputs of gate 122. The output of the oscillator is taken from the output of gate 124 and applied to a clock input CP of a decade counter 140 having an output Q. Three additional decade counters 142, 144, and 146 are provided each having a clock input CP coupled to the output Q of the preceding counter 140, 142, and 144, respectively. Each of the decade counters is used to provide a divide-by-10 function so that they produce at their outputs a signal at one-tenth the frequency of the signal applied to their clock inputs. Thus, the signals at the Q outputs of counters 140, 142, 144, and 146 are at 100 kHz, 10 kHz, 1 kHz, and 100 Hz, respectively. Three flip-flops 148, 150, and 152 are also provided each having a toggle input T and two outputs Q and $\overline{Q}$. The toggle input T of flip-flop 148 is coupled to the Q output of decade counter 146 while the toggle inputs of flip-flops 150 and 152 are coupled to the Q outputs of the preceding flip-flops 148 and 150, respectively. The flip-flops each provide a divide-by-2 function and provide a signal at their outputs at one-half the frequency of the signal applied to their inputs. Thus, the signals at the outputs of flip-flops 148, 150, and 152 are at 50 Hz, 25 Hz, and 12.5 Hz, respectively. Of course, the signal at the $\overline{Q}$ output of each flip-flop is merely the signal at the Q output but inverted.

The appropriate timing signals are derived from the outputs of decade counter 146 and flip-flops 148, 150, and 152. Output Q of flip-flop 152 is coupled to the clock inputs of flip-flops 54 and 56. Thus, output Q of flip-flop 152 is used to gate the passage of the premix signal from the amplifier including transistor 54 to the counter 58. A four-input NAND gate 154 is provided having first through fourth inputs coupled to the $\overline{Q}$ outputs of flip-flops 148, 150, and 152, and the Q output of decade counter 146. The output of gate 154 is coupled to the two inputs of a two-input NAND gate 156 which, in turn, has its output coupled to the clock inputs CP of each of the four-bit latch memories 68, 70, 72, 74, and 76. A four-input NAND gate 158 is provided having a first input coupled to the Q output of flip-flop 152, a second input coupled to the Q output of flip-flop 150, and third and fourth inputs coupled to the Q output of flip-flop 148. The output of gate 158 is coupled to the reset inputs of flip-flops 59 and 61. Finally, a two-input NAND gate 160 is provided having first and second inputs coupled to the Q and $\overline{Q}$ outputs of flip-flops 150 and 152, respectively, and an output coupled to the count/load inputs C/L of each of decade counters 58, 60, 62, 64, and 66.

The operation of the timing circuitry will be explained with reference to FIG. 3. In that figure, seven waveforms labelled A–E are shown representing the signals appearing at the correspondingly labelled locations in FIG. 2. The waveforms A–D represent the signals at the Q outputs of decade counter 146 and flip-flops 148, 150, and 152, respectively. The logic level 1 portions of waveform D are used to gate the divided down premix signal to the input of decade counter 58 and, accordingly, are labelled "gate" in FIG. 3. The signal at the output of gate 156 is shown at waveform E. As will be apparent from FIG. 2, it may be represented in logic notation as $A \cdot \overline{B} \cdot \overline{C} \cdot \overline{D}$. The logic level 1 portions of waveform E are used to transfer the information present at the inputs of the four-bit latch memories 68, 70, 72, 74, and 76 to the corresponding outputs and, accordingly, are labelled "transfer" in FIG. 3. The signal at the output of gate 158 is shown at waveform F and may be represented as $\overline{B} \cdot C \cdot D$. The logic level 1 portions of waveform F are used to reset flip-flops 59 and 61 so that each of their outputs Q are at logic level 0 at the commencement of a gate signal and, accordingly, are labelled "reset" in FIG. 3. The signal at the output of gate 160 is shown at waveform G and may be represented as $C \cdot \overline{D}$. The logic level 1 portions of waveform G are used to preset a given count into decade counters 58, 60, 62, 64, and 66 prior to the commencement of a gate signal and, accordingly, are labelled "preset" in FIG. 3.

Figure 3:
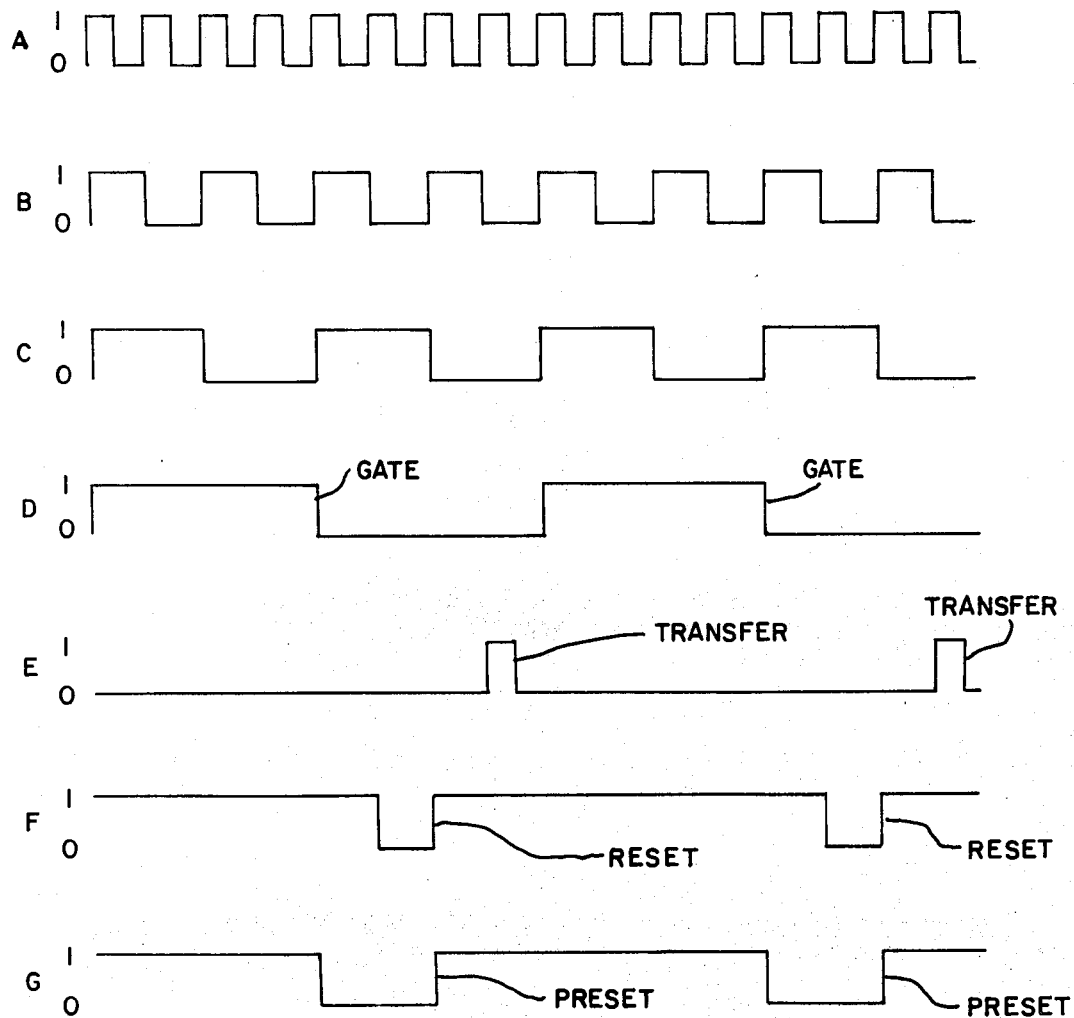
FIG. 3 is a series of waveforms for use in explaining the operation of the apparatus of FIG. 2.

As shown in FIG. 3, the sequence of operation is as follows. First, the flip-flops 59 and 61 are reset and a predetermined count set into decade counters 58, 60, 62, 64, and 66. Second, the divided down premix signal is gated to counter 58 so that it and the succeeding counters count the premix signal during the count interval, which count is applied to the inputs of the four-bit latch memories 68, 70, 72, 74, and 76. Third, after the termination of the gate signal, the count on the decade counters 58, 60, 62, 64, and 66 is transferred to the outputs of four-bit latch memories 68, 70, 72, 74, and 76. That transferred count is displayed on the digit displays 88, 90, 92, 94, and 96. Moreover, the digits displayed remain the same until after the completion of the next gate signal.

In order to preset a count into decade counters 58, 60, 62, 64, and 66, the P8 input of counters 58 and 60, the P1, P2, P4, and P8 inputs of counter 62, the P1 and P8 inputs of counters 64 and 66, and the P8 inputs of counters 58 and 60 are all coupled to ground. The P1, P2, and P4 inputs of decade counter 58 and the P1, P2, and P4 inputs of decade counter 60 are coupled to ground through resistors 162, 164, 166, 168, 170, and 172, respectively. A circuit point 174 is coupled to the anodes of diodes 176, 178, and 180 having their cathodes individually coupled to the P4 input of counter 58 and the P2 and P4 inputs of counter 60, respectively. A circuit point 182 is coupled to the anodes of diodes 184, 186, 188, and 190 having their cathodes individually coupled to the P2 and P4 inputs of counter 58 and the P1 and P2 inputs of counter 60, respectively. A circuit point 192 is coupled to the anodes of diodes 194, 196, and 198 having their cathodes individually coupled to the P1 and P2 inputs of counter 58 and the P4 input of counter 60, respectively. Circuit points 174, 182, and 192 are coupled to the mode selector apparatus 34. Logic level 0 signals are applied to each of circuit points 174, 182, 192 except that when the transceiver is in the LSB mode, a logic level 1 signal is applied to circuit point 174, and, similarly, when the transceiver is in the USB and CW modes, logic level 1 signals are applied to circuit points 182 and 192, respectively.

It will be apparent that when the decade counters 58, 60, 62, 64, and 66 are preset, a count of zero is placed in counter 62 and counts of 6 are placed into both counters 64 and 66. If, for example, the receiver is in the LSB mode, a count of 4 is set into counter 58 and a count of 6 is set into counter 60. Thus the number preset into the counters is 66064. In the USB and CW modes, the numbers preset into the counters are 66036 and 66043, respectively.

As mentioned, the frequency of HFO 18 for any band of the transceiver 8 is above the frequency of any signal in that band. Further, the frequency of VFO 24 is always below the frequencies of the signals present in the output of bandpass filter 20. Thus, in the LSB and USB modes and the CW-transmit mode the carrier frequency of the tuned signal is equal to the frequency of the HFO 18 less the frequency of the VFO 24 less the frequency of the BFO 27. The premix signal which is applied to the input of counter 40 has a frequency equal to the frequency of the HFO less the frequency of the VFO. Thus, the carrier frequency of the tuned signal is equal to the frequency of the premix signal less the frequency of BFO 27. In order to achieve a direct display of the carrier frequency of the tuned signal, it is required that the frequency of the premix signal be counted but that the counter initially be programmed to a number below zero corresponding to the frequency of BFO 27.

In the CW-receive mode the situation is slightly different. There the BFO frequency must be offset from the frequency corresponding to the carrier frequency by approximately 700 Hz and the carrier frequency of the tuned signal is equal to the frequency of the premix less the difference of the frequency of BFO 27 and 700 Hz. Thus, to achieve a direct display of the tuned signal carrier frequency, the counter must be initially programmed to a number below zero corresponding to the frequency of BFO 27 less 700 Hz. For the BFO frequencies mentioned above, the frequency of BFO 27 during the CW-receive mode, 3.3964 MHz, less 700 Hz is 3.3957 MHz and is equal to the BFO frequency used during the CW-transmit mode. Thus, the number programmed into the counters will be the same for both the CW-transmit and the CW-receive modes despite the use of different BFO frequencies on those two modes.

From the discussion in the preceding two paragraphs it is apparent that the number which is programmed into the counters is related to the intermediate frequency of the transceiver for the corresponding mode of operation. The intermediate frequency is that frequency which corresponds to the carrier frequency of the signals present at the outputs of bandpass filters 26 and 47 in the transceiver 8. In particular, even though different BFO frequencies are used in the CW-transmit and CW-receive modes, the intermediate frequencies on those two modes are the same and the same number is programmed into the counters for operation in those two modes.

In the apparatus of FIG. 2, the frequency of the gate signal is 12.5 Hz and it has a duration of one-half the period of the 12.5 Hz signal or 0.04 sec. Further, the frequency of the premix signal is divided by 4 before it is applied to counter 58. Thus, if the counters 58, 60, 62, 64, and 66 were preset to zero prior to the commencement of each gate pulse, the digit displays 88, 90, 92, 94, and 96 would display five significant digits of the premix signal frequency, digit 88 being the least significant of the five digits displayed and representing 0.1 kHz and digit 96 being the most significant of the five digits displayed and representing 1,000 kHz. However, as mentioned in the apparatus of FIG. 2, the counters 58, 60, 62, 64, and 66 are set to a count below zero which varies according to the mode of operation of the transceiver. For example, in the LSB mode on either transmit or receive, the counters are preset to 66064 so that a count of the BFO frequency, 3393.6 kHz, will set each of the counters 58, 60, 62, 64, and 66 to zero and the total count achieved by the counters during a single gate pulse and displayed on the digit displays will be equal to five significant digits of the carrier frequency of the received signal. Digit 88 will be the least significant of the five digits displayed and represent 0.1 kHz and digit 96 will be the most significant of the digits displayed and represent 1,000 kHz. The decimal point included in digit display 90 places the decimal between the digits of displays 88 and 90 so that the overall display provided by digits 88, 90, 92, 94, and 96 is in kHz. Digit display 112 provides a sixth significant digit in the display of the received carrier frequency in representing 10,000 kHz. That digit could be generated through the use of an additional decade counter coupled to counter 66 and an additional four-bit latch memory coupled to the additional decade counter and the binary-coded-decimal to seven-segment converter 110. However, in the disclosed receiver, the value of the sixth significant digit is determined by the frequency band to which the receiver is tuned by band selector apparatus 32. Thus, circuit points 116, 118, and 120 are coupled to the band selector apparatus 32 so that digit display 112 is blank when the receiver is tuned to the 80 and 40 meter bands, so that it displays the numeral 1 when the receiver is tuned to the WWV and 20 meter bands, and so that it displays the numeral 2 when the receiver is tuned to the 15 and 10 meter bands.

In one operative embodiment of a transceiver of this invention, the components used are more fully identified as follows:

| | |
|---|---|
| 46 | 36 pfd. |
| 50 | 2N2369 |
| 51 | 3,900 ohms |
| 52, 53 | 1,000 ohms |
| 54, 56 | SN74H103 |
| 58, 60, 62, 64, 66 | 74196 |
| 68, 70, 72, 74, 76 | SN7475N |
| 78, 80, 82, 84, 86, 110 | DM-8880 |
| 122, 124, 156, 160 | SN7400N |
| 128, 134 | 680 ohms |
| 130 | 0.005 mfd. |
| 132 | 150 ohms |
| 136 | 5 pfd. |
| 138 | 2–8 pfd. |
| 140, 142, 144, 146 | SN7490N |
| 148, 150, 152 | SN7473N |
| 154, 158 | SN7420N |
| 162, 164, 166, 168, 170, 172 | 220 ohms |
| 176, 178, 180, 184, 186, 188, 190, 194, 196, 198 | 1N4149 |

In FIG. 2, the required power supply and ground connections to many of the circuit elements have not been shown. However, the manner in which they are supplied will be apparent to those skilled in the art. In constructing an apparatus of FIG. 2 if a common power supply is used as positive voltage source V, it is desirable to include means for blocking the flow of high frequency signals between the various components through the power supply connections.

It will be apparent that the display apparatus of this invention may readily be adapted for other modes of operation of the transceiver 8. For example, if that transceiver were operative in the amplitude modulation (AM) mode, in order to obtain a correct indication of the carrier frequency of the tuned signal, it would merely be necessary to program a count into the counters 58–66 which is less than zero by an amount corresponding to the center frequency of bandpass filter 26, that frequency then being the intermediate frequency of receiver 10. In the AM mode, of course, BFO 27 would not be required for the operation of receiver 10 but only for transmitter 45.

It will thus be seen that frequency measuring and indicating apparatus have been provided which fulfill each of the aforementioned objects. In particular, the disclosed apparatus provides a direct reading, visual frequency indicator which is operable with multi-frequency conversion radio apparatus capable of tuning signals in a plurality of different modes. The disclosed apparatus is economical in that relatively inexpensive and readily available components are used to provide the desired display. The disclosed apparatus is highly accurate in that it compensates for unintentional variations in the frequencies of both the local oscillators, high frequency oscillator 18 and variable frequency oscillator 24, such as might be caused by drift, operating temperature variations, component aging, power supply fluctuations, etc. In this connection, it should be noted that in most modern day, high quality receivers, the beat frequency oscillator is crystal controlled so that variations in its operating frequency are of relatively minor importance compared to variations in the frequency of the local oscillators.

Further, the accuracy of the disclosed apparatus is improved because even though it is used with a multi-conversion radio apparatus, it is only required to perform a single counting operation each time the tuned frequency is measured. This permits two ways in which the accuracy of the apparatus may be improved. The length of the counting period may be increased or the measuring apparatus may be performed at a faster rate. The second manner is especially advantageous when the frequency of the tuned signal is changing rapidly, especially during periods when the associated apparatus is initially warming up.

While particular embodiments of the invention have been disclosed herein, it will be understood, of course, that the invention is not to be limited thereto since many modifications may be made. It is contemplated, therefore, by the appended claims, to cover any such modifications as fall within the true spirit and scope of this invention.

I claim:

1. A digital tuning indicator for use with a multi-conversion radio apparatus including a plurality of local oscillators, said indicator comprising:
   mixing means coupled to each of said local oscillators and forming a premix signal having a frequency responsive to the frequencies of operation of said local oscillators;
   counting means coupled to the output of said mixing means and forming a count responsive to the number of cycles of said premix signal occurring over a period of predetermined length;
   display means coupled to said counting means for displaying the count achieved by said counting means at the end of said period; and
   programming means coupled to said counting means for altering the count attained on said counting means by an amount related to an intermediate frequency of said radio apparatus.

2. The digital tuning indicator of claim 1 wherein said programming means further loads a count into said counting means related to an intermediate frequency of said apparatus prior to the commencement of said period.

3. A digital tuning indicator for use with a multiconversion radio apparatus having a single apparatus for tuning signals of a plurality of modes and including a plurality of local oscillators, said indicator comprising:
   mixing means coupled to each of said local oscillators and forming a premix signal having a frequency responsive to the frequencies of operation of said local oscillators;
   counting means coupled to the output of said mixing means and forming a count responsive to the number of cycles of said premix signal occurring over a period of predetermined length;
   display means coupled to said counting means for displaying the count achieved by said counting means at the end of said period; and programming means coupled to said counting means for altering the count attained on said counting means by an amount variable in response to alterations in the mode of said tuned signal.

4. A radio apparatus comprising:
tuning means including a fixed frequency local oscillator and a variable frequency local oscillator;
detection means including a beat frequency oscillator;
mixing means coupled to said fixed frequency local oscillator and said variable frequency local oscillator and forming a premix signal having a frequency responsive to the frequencies of operation of said local oscillators;
counting means coupled to the output of said mixing means and forming a count responsive to the number of cycles of said premix signal occurring over a period of predetermined length;
display means coupled to said counting means for displaying the count achieved by said counting means at the end of said period; and
programming means coupled to said counting means for loading a count into said counting means variable in response to alterations of an intermediate frequency of said apparatus prior to the commencemet of said period.

5. A digital tuning indicator for use with a multiple frequency conversion radio apparatus having a single tuning apparatus operable at a plurality of intermediate frequencies and including a first circuit for generating a first local oscillator signal and a second circuit for generating a second local oscillator signal, said tuning indicator comprising:
mixing means coupled to said first local oscillator circuit and said second local oscillator circuit and forming a premix signal having a frequency which varies in response to variations in the frequencies of said first local oscillator signal and said second local oscillator signal;
counting means coupled to the output of said mixing means and forming a count responsive to the number of cycles of said premix signal occurring over a period of predetermined length;
display means coupled to said counting means for displaying the count achieved by said counting means at the end of said period; and
programming means coupled to said counting means for loading a count into said counting means prior to the commencement of said period, said count being variable in response to alterations in said intermediate frequency.

6. A multiple frequency conversion radio receiver comprising:
a single tuning apparatus operable at a plurality of intermediate frequencies and including a first circuit for generating a first local oscillator signal at a nominally fixed frequency and a second circuit for generating a second local oscillator signal at a variable frequency;
mixing means coupled to said first local oscillator circuit and said second local oscillator circuit and forming a premix signal having a frequency which varies in response to variations in the frequencies of said first local oscillator signal and said second local oscillator signal;
counting means coupled to the output of said mixing means and making a count responsive to the number of cycles of said premix signal occurring over a period of predetermined length;
display means coupled to said counting means for displaying the count achieved by said counting means at the end of said period; and
programming means coupled to said counting means for altering the count attained by said counting means by an amount variable in response to alterations in said intermediate frequency.

7. The radio receiver of claim 6 wherein said programming means further loads a count into said counting means prior to the commencement of said period, said count being variable in response to alterations in said intermediate frequency.

8. The radio receiver of claim 7 wherein the frequency of said first local oscillator signal is greater than the frequency of said second local oscillator signal.

* * * * *